(12) United States Patent
Ito et al.

(10) Patent No.: US 11,475,373 B2
(45) Date of Patent: Oct. 18, 2022

(54) LEARNING MANAGEMENT SYSTEM AND LEARNING MANAGEMENT METHOD

(71) Applicant: Hitachi, Ltd., Tokyo (JP)

(72) Inventors: Kiyoto Ito, Tokyo (JP); Taiki Fuji, Tokyo (JP); Kanako Esaki, Tokyo (JP); Kohsei Matsumoto, Tokyo (JP)

(73) Assignee: HITACHI, LTD., Tokyo (JP)

(*) Notice: Subject to any disclaimer, the term of this patent is extended or adjusted under 35 U.S.C. 154(b) by 496 days.

(21) Appl. No.: 16/668,892

(22) Filed: Oct. 30, 2019

(65) Prior Publication Data
US 2020/0134509 A1 Apr. 30, 2020

(30) Foreign Application Priority Data

Oct. 31, 2018 (JP) .............................. JP2018-205053

(51) Int. Cl.
*G06N 20/20* (2019.01)
*G06F 17/15* (2006.01)
*G06F 30/20* (2020.01)

(52) U.S. Cl.
CPC ............. *G06N 20/20* (2019.01); *G06F 17/15* (2013.01); *G06F 30/20* (2020.01)

(58) Field of Classification Search
CPC ........ G06N 20/20; G06N 20/00; G06F 17/15; G06F 30/20; G06Q 10/08
See application file for complete search history.

(56) References Cited

U.S. PATENT DOCUMENTS

| | | | |
|---|---|---|---|
| 2013/0185437 A1* | 7/2013 | Willig ................... | G05B 15/02 709/226 |
| 2015/0192922 A1* | 7/2015 | He ..................... | G05B 19/4188 700/96 |
| 2017/0139382 A1* | 5/2017 | Sayyarrodsari ...... | G05B 23/024 |

FOREIGN PATENT DOCUMENTS

| | | |
|---|---|---|
| JP | 2011065224 A | 3/2011 |
| JP | 2015106316 A | 6/2015 |

* cited by examiner

*Primary Examiner* — Sam K Ahn
*Assistant Examiner* — Amneet Singh
(74) *Attorney, Agent, or Firm* — Miles & Stockbridge, PC

(57) ABSTRACT

A retail agent determines a parameter of an activity proposal model by using data stored in a past record database, and determines parameters of an activity determination model and an activity value evaluation model by further using base activity simulation data. Consequently, it is possible to appropriately determine parameters of a subsystem control method in a complex system which cannot be embodied as a simulator and shows a significant change with respect to past record data.

4 Claims, 8 Drawing Sheets

FIG. 6

RETAIL ○○ RECORD DATA REGISTRATION — 2111

| ID | GOODS | BACK ORDER | STOCK | ORDER |
|---|---|---|---|---|
| | | | | |
| | | | | |
| | | | | |
| | | | | |

LEARNING MANAGEMENT SYSTEM AND LEARNING MANAGEMENT METHOD

BACKGROUND OF THE INVENTION

1. Field of the Invention

The present invention relates to a learning management system and a learning management method.

2. Description of the Related Art

In recent years, complexity of a social system which includes various subsystems such as supply chain systems, energy supply chain systems, traffic systems and financial systems and in which these systems are intertwined is increasing day by day.

Each subsystem is requested to determine an action (an output from each subsystem) from moment to moment to maximize an accomplishment goal (a decision index indicating performance of each subsystem) according to a situation (a state or a restriction which is an input from each subsystem). A situation in which each subsystem is installed changes at all times, and therefore there is a limit for people to predict every situation, and program an optimal action of each system as a subsystem control method.

Hence, a technique of predicting an optimal action of such a subsystem by utilizing a simulation or data, or determining parameters of the subsystem control method is gaining attention. For example, JP 2011-65224 A proposes a technique of repeating simulation in units of factories and simulation of an overall supply chain for products of a plurality of factories, and promoting efficiency of the supply chain. Furthermore, J P 2015-106316 A discloses an energy management system which can simultaneously predict power demand amounts and heat demand amounts of a plurality of facilities from weather forecast data, and past record data of power demand amounts and heat demand amounts.

SUMMARY OF THE INVENTION

The technique disclosed in JP 2011-65224 A is a technique which uses simulation, and therefore has a problem that, when types of goods to be distributed become enormous as in supply chains, and demands of clients for goods to be distributed are rapidly changing, it is difficult to realize simulation which covers every possible pattern.

Furthermore, when record data is used to perform prediction as in JP 2015-106316 A, there is a problem that the prediction is not reliable at all in a situation which is far from the past record data.

An object of the present invention is to provide a learning management system and a learning management method which can appropriately determine parameters of a subsystem control method in a complex system which cannot be embodied as a simulator and shows a significant change with respect to past record data.

The above and other objects and new features of the present invention will be made apparent from the disclosure and the accompanying drawings of this description.

An outline of typical inventions among the inventions disclosed in this application will be briefly described as follows.

A learning management system which learns a behavior of a predetermined control target according to a typical embodiment of the present invention includes: a record data storage unit which accumulates past record data of the control target; a first model storage unit which stores a first correlation model which outputs measure proposal data from data related to the behavior of the control target; a second model storage unit which stores a second correlation model which outputs measure data from simulation state data and the measure proposal data, the simulation state data simulating the behavior of the control target; a third model storage unit which stores a third correlation model which outputs a measure evaluation value from the simulation state data, the measure proposal data and the measure data; a first record learning unit which determines a parameter of the first correlation model by calculating a correlation between the data related to the behavior of the control target, and the measure proposal data based on a predetermined evaluation value and the past record data stored in the record data storage unit; a simulation state data obtaining unit which obtains the simulation state data which simulates the behavior of the control target; a measure data generating unit which generates the measure proposal data by inputting the simulation state data obtained by the simulation state data obtaining unit to the first correlation model, and generates the measure data by inputting the simulation state data obtained by the simulation state data obtaining unit and the measure proposal data to the second correlation model; an activity learning unit which determines parameters of the second correlation model and the third correlation model based on the simulation state data obtained by the simulation state data obtaining unit, the measure proposal data generated by the measure data generating unit, the measure data generated by the measure data generating unit, and a predetermined evaluation logic; and a second record learning unit which determines the parameter of the first correlation model again by calculating the correlation between the data related to the behavior of the control target and the measure proposal data based on an evaluation value obtained by the third correlation model, and the past record data stored in the record data storage unit.

An effect obtained by the typical inventions among the inventions disclosed in this application will be briefly described as follows.

That is, according to a typical embodiment of the present invention, it is possible to appropriately determine parameters of a subsystem control method in a complex system which cannot be embodied as a simulator and shows a significant change with respect to past record data.

BRIEF DESCRIPTION OF THE DRAWINGS

FIG. 6 is a view illustrating one example of a screen displayed on a retail terminal according to the present embodiment;

DESCRIPTION OF THE PREFERRED EMBODIMENTS

Figure 1:
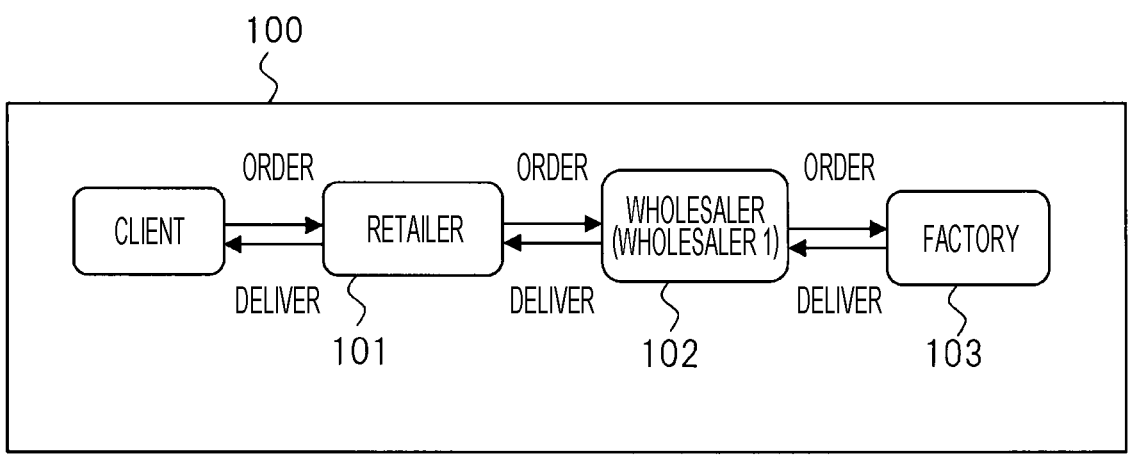
FIG. 1 is a view illustrating an outline of a supply chain according to the present embodiment.

Hereinafter, an embodiment of the present invention will be described in detail with reference to the drawings. In addition, the same components will be fundamentally assigned the same reference numerals in all drawings for explaining the embodiment, and repetition of the description thereof will be omitted. On the other hand, the components which are described by assigning reference numerals in certain drawings will not be illustrated again when the other drawings are described, yet will be assigned the same reference numerals and mentioned in some cases.

The embodiment of the present invention will be described below with reference to the drawings. The following description and the drawings are exemplary ones for explaining the present invention, and will be omitted or simplified as appropriate for clarification of the description. The present invention can be carried out in other various modes, too. Unless limited in particular, each component may be singular or plural.

A position, a size, a shape and a range of each component illustrated in the drawings are not illustrated as an actual position, size, shape and range in some cases for ease of understanding of the invention. Hence, the present invention is not necessarily limited to positions, sizes, shapes and ranges illustrated in the drawings.

Various pieces of information will be described below as expressions such as a "table", a "list", and a "cue". However, the various pieces of information may be expressed as data structures other than these words. An "XX table" and an "XX list" will be referred to as "XX information" to indicate that there is no dependence on data structures. Expressions such as "identification information", an "identifier", a "name", an "ID", and a "number" will be used to describe identification information. However, these expressions can be replaced with each other.

When there is a plurality of components having identical or similar functions, a plurality of elements will be described by assigning different subscripts to the identical reference numeral in some cases. In this regard, when a plurality of these components does not need to be distinguished, a plurality of elements will be described by omitting the subscripts in some cases.

The present embodiment will describe a supply chain 100 illustrated in FIG. 1 as a complex system. FIG. 1 illustrates that three bases which are a retailer 101 which sells goods to clients, a wholesaler 102 which distributes the goods, and a factory 103 which produces the goods mutually place orders, and deliver the goods to distribute. A serial supply chain including the factory, the wholesaler and the retailer will be described with reference to FIG. 1 for ease of description. However, the present embodiment is not limited to this supply chain, and is applicable to chains of different modes, too.

Figure 2:
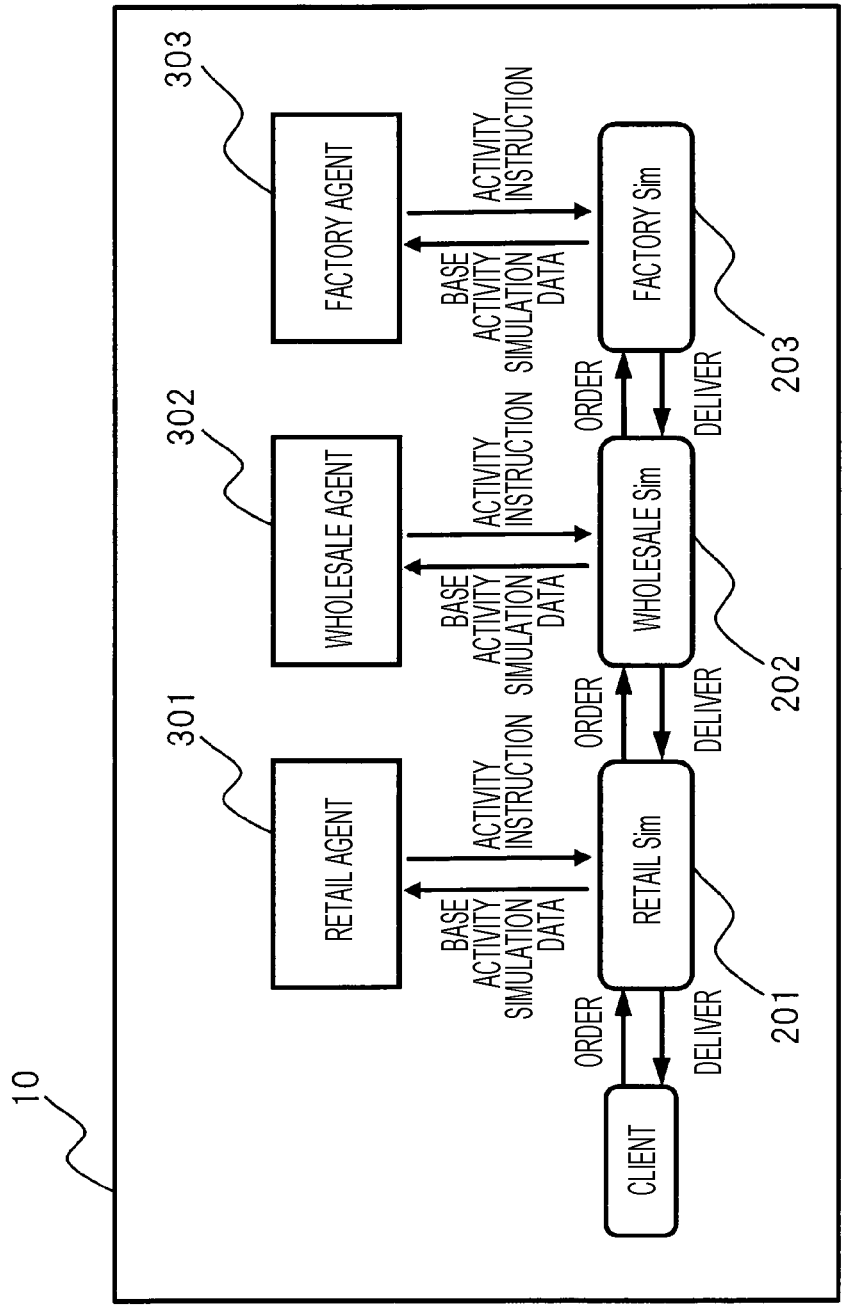
FIG. 2 is a view illustrating an outline of a learning management system according to the present embodiment.

FIG. 2 is a view illustrating an outline of a learning management system 10 according to the present embodiment. In the learning management system 10, a retail simulator (retail Sim) 201 which simulates a business activity at a base of the retailer 101, a wholesale simulator (wholesale Sim) 202 which simulates a business activity of the wholesaler 102, and a factory simulator (factory Sim) 203 which simulates a business activity of the factory 103 are connected based on a relationship of order placement and delivery in the supply chain 100. In this regard, the business activity indicates a predetermined operation which is necessary to trade resources such as a minimum article and cash from order acceptance to dispatch of goods at each base (e.g., retailer 101).

Furthermore, each base simulator (such as the retail simulator 201) is connected with an agent (such as a retail agent 301) which instructs a business activity of the base. That is, the retail simulator 201 is connected with the retail agent 301, the wholesale simulator 202 is connected with a wholesale agent 302, and the factory simulator 203 is connected with a factory agent 303. Each of the above base simulators is, for example, an information processing device (server) which can execute a known simulation function.

Each agent (such as the retail agent 301) receives data of a base activity (base activity simulation data) simulated by simulation by each connected base simulator (such as the retail simulator 201), and gives a business activity instruction of the base to each simulator based on the data. In one example, the base activity simulation data is a daily stock amount, back order amount, history of receiving and shipping, and history of order acceptance and order placement of predetermined goods at the base. The business activity instruction is the daily order amount of predetermined goods.

Figure 3:
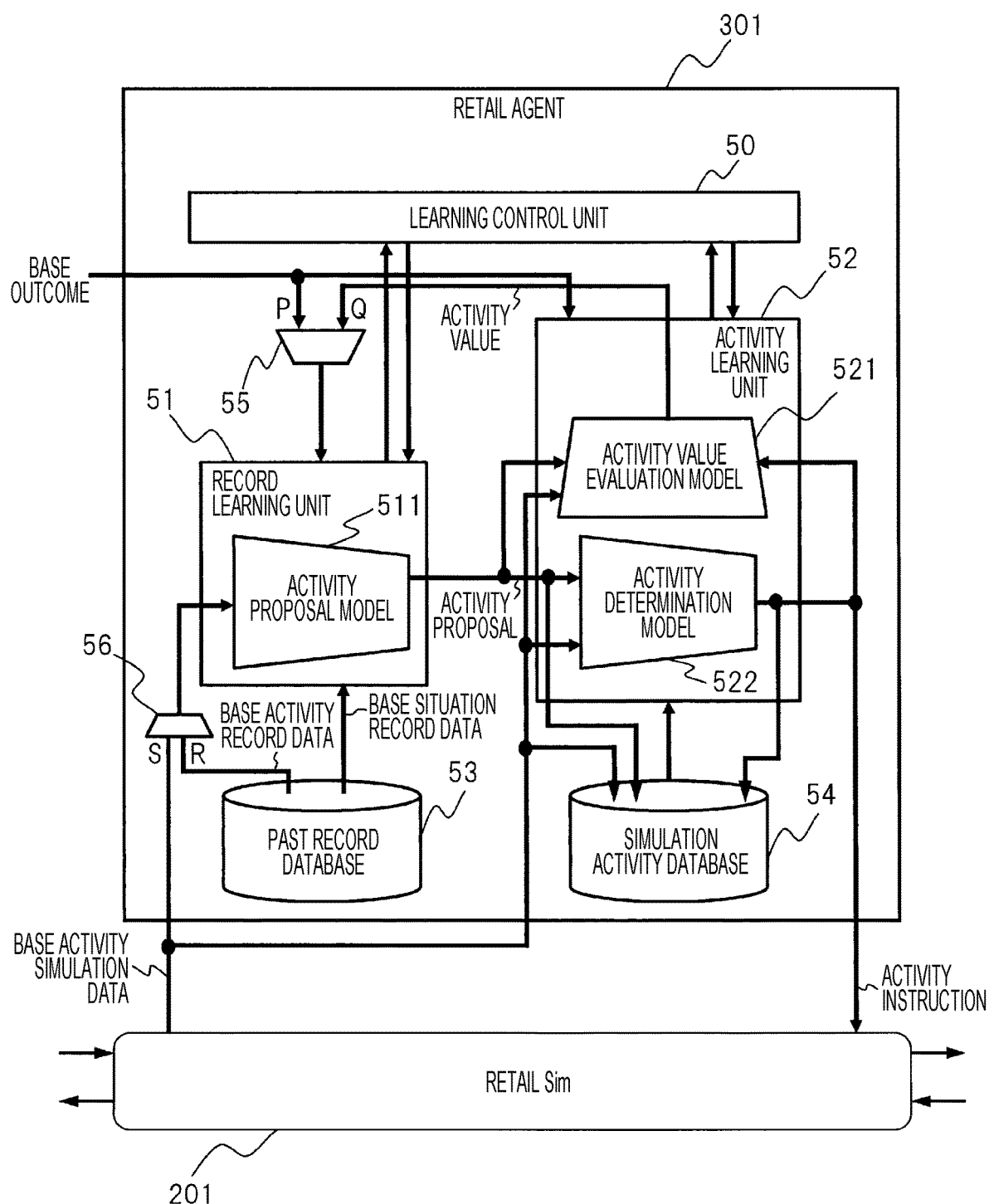
FIG. 3 is a view illustrating a configuration of a retail simulator and a retail agent according to the present embodiment.

FIG. 3 is a view illustrating one of embodiments of the retail agent 301. In this regard, the wholesale agent 302 and the factory agent 303 also indicate the same mode of the retail agent 301 in description of the present embodiment, and therefore the same description thereof will be omitted.

As illustrated in FIG. 3, the retail agent 301 includes a learning control unit 50, a record learning unit 51, an activity learning unit 52, a past record database 53, a simulation activity database 54, a selector 55, and a selector 56.

The retail agent 301 is an agent which instructs the business activity of the base as described above, and functions as the learning management system which learns a behavior of a retailer (control target). The retail agent 301 is specifically a server device.

The past record database 53 of the retail agent 301 is a component which accumulates control target past record data. The record learning unit 51 is a component which stores an activity proposal model 511 (first correlation model) which outputs an activity proposal (measure proposal data) from data related to a control target behavior. That is, the record learning unit 51 functions as a first model storage unit. In this regard, the data related to the control target behavior indicates control target past record data or simulation state data.

The activity learning unit 52 is a component which stores an activity determination model 522 (second correlation model) and an activity value evaluation model 521 (third correlation model). That is, the activity learning unit 52 functions as a second model storage unit and a third model storage unit. The activity determination model 522 outputs an activity instruction (measure data) from the simulation state data and the measure proposal data. Furthermore, the activity value evaluation model 521 outputs an activity value (measure evaluation value) from the simulation state data, the activity proposal and the activity instruction.

The record learning unit 51 is a component which determines a parameter of the activity proposal model 511 by calculating a correlation between data related to a behavior of the control target, and the measure proposal data based on a base outcome (predetermined evaluation value), and the past record data stored in the past record database 53.

Furthermore, the record learning unit 51 is a component which determines a parameter of the activity value evaluation model 521 again by calculating a correlation between the data related to the behavior of the control target, and the activity proposal based on the activity value (evaluation value) obtained by the activity value evaluation model 521, and the past record data stored in the past record database 53. That is, the record learning unit 51 functions as a first record learning unit and a second record learning unit.

Furthermore, as described above, the record learning unit 51 newly obtains base activity simulation data based on an adjustment amount of the parameter which is a result obtained by calculating the correlation between the data related to the behavior of the control target and the activity proposal based on the activity value (evaluation value) obtained by the activity value evaluation model 521 and the past record data stored in the past record database 53.

Furthermore, the record learning unit 51 and the activity learning unit 52 obtain base activity simulation data from the retail Sim (retail simulator) 201 at a predetermined timing. That is, the record learning unit 51 and the activity learning unit 52 function as simulation state data obtaining units.

Furthermore, the record learning unit 51 generates an activity proposal by inputting the base activity simulation data to the activity proposal model at a predetermined timing. Furthermore, the activity learning unit 52 generates an activity instruction by inputting the base activity simulation data and the activity proposal generated by the record learning unit 51 to the activity determination model 522. Thus, the record learning unit 51 and the activity learning unit 52 function as measure data generating units. Furthermore, the activity learning unit 52 associates the base activity simulation data, the activity proposal and the activity instruction to register in the simulation activity database 54. Thus, the simulation activity database 54 functions as a simulation activity data storage unit.

The activity learning unit 52 determines parameters of the activity determination model 522 and the activity value evaluation model 521 based on the base activity simulation data, the activity proposal, the activity instruction, and a predetermined evaluation logic.

The learning control unit 50 is a component which controls processing of the retail agent 301, and controls operations of the record learning unit 51 and the activity learning unit 52.

Figure 4:
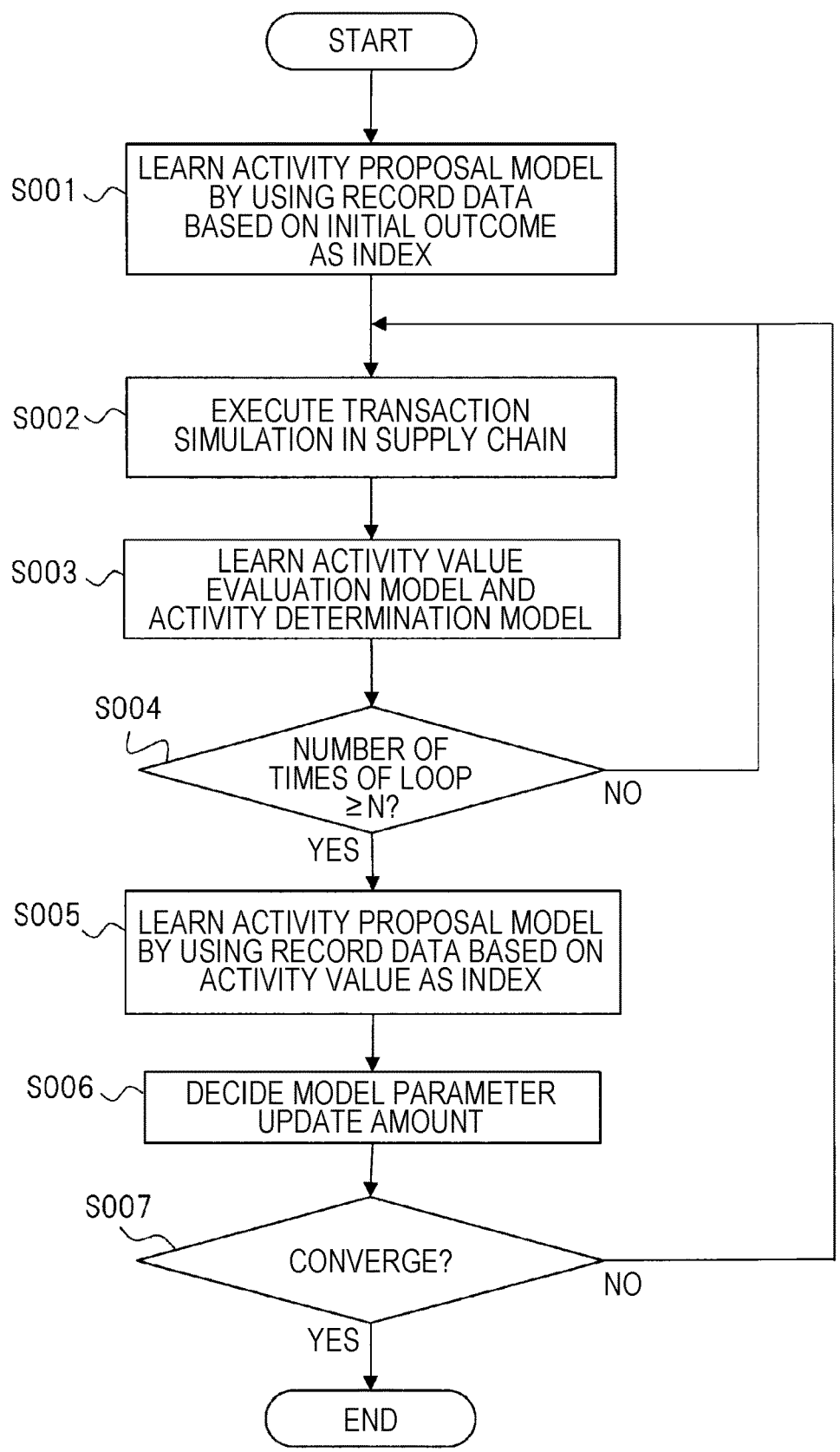
FIG. 4 is a flowchart for explaining a procedure of learning processing of the retail agent according to the present embodiment.

Subsequently, a processing flow of determining the parameter of each model of the activity proposal model 511, the activity value evaluation model 521 and the activity determination model 522 will be described with reference to FIG. 4. This processing operates at the predetermined timing (e.g., once in a month).

First, in step S001, the activity proposal model 511 is learned by using record data (data of the past record database 53) based on an initial outcome as an index. Specifically, when the learning control unit 50 instructs the record learning unit 51 to learn a record, the record learning unit 51 reads base situation record data and base activity record data from the past record database 53.

Furthermore, the selector 55 selects a signal P, and gives a base outcome (profit index value) externally indicated in advance as a learning outcome to the record learning unit 51. Furthermore, the record learning unit 51 calculates a correlation between base situation record data, base activity record data, and a learning outcome by a predetermined record correlation learning algorithm. The record learning unit 51 adjusts the parameter of the activity proposal model 511 by an activity proposal learning algorithm to receive an input of the base activity record data and output an activity proposal which maximizes the learning outcome by using the calculated correlation.

One example of adjustment of the parameter of the activity proposal model in step S001 will be more specifically described. It is supposed that the learning control unit 50 registers a stock amount, a back order amount, a history of receiving and shipping, and a history of order acceptance and order placement of predetermined goods at a base similar to the base activity simulation data and, in addition, the daily number of visiting customers of the retailer 101, a daily temperature, and a daily weather as base situation record data in the past record database 53 in advance.

Similarly, the learning control unit 50 registers a daily order amount of the predetermined goods of the retailer 101 as the base activity record data in the past record database 53 in advance. Furthermore, the learning control unit 50 sets a weekly profit of the retailer 101 which can be gained from the predetermined goods as a learning outcome.

The record learning unit 51 obtains the base activity record data and the base situation record data from the past record database 53, and calculates a correlation (first correlation) between the weekly profit gained from the predetermined goods, and a base situation defined by the base situation record data, and a correlation (second correlation) between a transition of the base situation and a base activity (order amount). That is, the record learning unit 51 can propose the optimal base situation which maximizes the weekly profit by using the first correlation, and can propose an optimal base activity (order amount) which realizes the optimal base situation by using the second correlation.

By coupling these two correlations, the record learning unit 51 adjusts the parameter for the activity proposal model 511 to propose an optimal base activity according to the base situation defined by the base situation record data.

The record correlation learning algorithm and the activity proposal learning algorithm do not limit algorithms in particular in the present embodiment, yet can be realized by a neural network or a combination of the neural network or another algorithm in one embodiment.

After step S001, transaction simulation in the supply chain is executed in step S002. The retail agent 301 obtains the base activity simulation data such as the stock amount from the retail simulator 201, generates an activity proposal and an activity instruction by using the base activity simulation data, and transmits the activity instruction to the retail Sim 201. The retail simulator 201 carries out a transaction with each base simulator according to the activity instruction outputted by the retail agent 301, and executes simulation (simulation of a known technique) which distributes goods.

In this regard, the simulation is executed in a predetermined time unit which is one loop. The retail agent 301 selects the signal S in the selector 56 in each loop of the simulation. In this regard, the record learning unit 51 obtains the base activity simulation data from the retail simulator 201, and calculates the activity proposal by using the activity proposal model 511 from the base activity simulation data. The activity proposal described herein indicates a base activity (order amount) for realizing an optimal base situation.

In this case, the record learning unit 51 gives a fixed value or a random value to data (the daily number of visiting customers, the daily temperature, and the daily weather in the above example) which does not overlap the base activity simulation data among the base situation record data for the activity proposal model 511.

Next, the activity learning unit 52 of the retail agent 301 calculates an activity instruction from the calculated activity proposal and the base activity simulation data by using the activity determination model 522. This activity instruction is a parameter (the order amount in this case) used for simulation. The activity learning unit 52 sends the calculated activity instruction to the retail simulator 201. In addition, the activity learning unit 52 may correct the calculated activity instruction at random.

Furthermore, the activity learning unit 52 of the retail agent 301 registers in the simulation activity database 54 the base activity simulation data received from the retail simulator 201, the activity proposal obtained by the activity proposal model 511, and the activity instruction obtained by the activity determination model 522 in each loop of the simulation.

Thus, by associating and storing the base activity simulation data, the activity proposal obtained by the activity proposal model 511, and the activity instruction obtained by the activity determination model 522, the retail agent 301 can appropriately execute learning of the activity value evaluation model 521 and the activity determination model 522 by using these pieces of information.

In step S003, the activity value evaluation model 521 and the activity determination model 522 are learned. Specifically, the learning control unit 50 gives the activity learning instruction to the activity learning unit 52. The activity learning unit 52 reads the base activity simulation data, the activity proposal, and the activity instruction from the simulation activity database 54. Furthermore, the activity learning unit 52 calculates a correlation between the given base outcome, the base activity simulation data, the activity proposal, and the activity instruction by a predetermined activity evaluation learning algorithm. The activity learning unit 52 may store the base outcome in advance.

Furthermore, the activity learning unit 52 adjusts the parameter of the activity value evaluation model 521 to output the correlation between the base activity simulation data, the activity proposal and the activity instruction, and the base outcome as an activity value. Simultaneously, the activity learning unit 52 adjusts the parameter of the activity determination model 522 by the predetermined activity learning algorithm to receive an input of the activity proposal and activity simulation data, and output the activity instruction which maximizes the base outcome. In this regard, the above activity value is, for example, sales.

One example of adjustment of the parameter of the activity value evaluation model 521 in step S003 will be more specifically described. The activity learning unit 52 obtains the base outcome as a weekly profit which can be gained from the predetermined goods of the retailer 101. Furthermore, when the activity proposal model 511 makes a predetermined activity proposal in a base simulation situation of the retailer 101 defined by predetermined base activity simulation data (the stock amount, the back order amount, the history of receiving and shipping, and the history of order acceptance and order placement), the activity learning unit 52 adjusts the parameter of the activity value evaluation model 521 to predict a profit which can be gained by a certain base activity (order amount) as an activity value.

In this case, the base activity simulation data reflects a result of the simulation executed in step S003. Therefore, a feature of the activity value evaluation model 521 is that it is possible to predict a profit in a base situation which is not included in the past record data, or a profit which takes a simulation response of an overall supply chain into account.

Furthermore, one example of adjustment of the parameter of the activity determination model 522 in step S003 will be specifically described. First, the activity learning unit 52 obtains the base outcome as a weekly profit which can be gained from the predetermined goods of the retailer 101.

Furthermore, the activity learning unit 52 adjusts the parameter in a case where the activity instruction is a daily order amount in the base simulation situation of the retailer 101 defined by the base activity simulation data. That is, by predicting the optimal base simulation situation which maximizes the weekly profit and predicting the optimal activity instruction which results in the optimal base simulation situation in the above case, the activity learning unit 52 adjusts the parameter to output an optimal activity instruction in a predetermined base simulation situation. In addition, the above base activity simulation data is the daily stock amount, back order amount, history of receiving and shipping, and history of order acceptance and order placement.

The activity evaluation learning algorithm and the activity learning algorithm do not limit algorithms in particular in the present embodiment, yet can be realized by the neural network or a combination of the neural network or another algorithm in one embodiment.

In step S004, the retail agent 301 decides an end of the loop according to a predetermined number N given in advance. That is, when the number of times of the loop is less than N (e.g., 10000), the flow returns to step S002. When the number of times of the loop is N or more, the flow moves to step S005.

In step S005, the activity proposal model 511 is learned by using record data based on the activity value as an index. Specifically, the learning control unit 50 gives a record learning instruction to the record learning unit 51, and performs the same processing as that in step S001. In this regard, a difference between step S002 and step S005 is that, in step S005, the selector 55 selects a signal Q, and gives an activity value outputted by the activity value evaluation model as an learning outcome to the record learning unit 51.

Thus, the record learning unit 51 adjusts the parameter of the activity proposal model 511 by the activity proposal learning algorithm to output the activity proposal which maximizes the activity value outputted by the activity value evaluation model 521.

More specifically, while the parameter is adjusted for a base profit included in the past record data in step S001, the activity value evaluation model 521 is used in step S005. Consequently, it is possible to adjust the parameter for a profit in a base situation which is not included in the base record data, or a profit which takes a response of the overall supply chain into account. Furthermore, by using the past record data as an input similar to step S001, record data (such as the daily number of visiting customers, the daily temperature, and the daily weather) which is hardly calculated by the simulation can be also reflected in adjustment of the parameter.

In step S006, a model parameter update amount is decided. That is, the retail agent 301 decides convergence of the adjustment amount of the parameter of the activity proposal model. For example, a previous adjustment amount in step S006 and a current adjustment amount are compared for the parameter adjustment amount of the activity proposal model 511, and, when a root mean square of a difference between the adjustment amounts is a predetermined threshold or more (step S007: No), the flow returns to step S002. In this step S002, the retail agent 301 obtains the base activity simulation data again, i.e., performs processing subsequent to step S002.

That is, as described above, the record learning unit 51 newly obtains base activity simulation data based on the adjustment amount of the parameter which is the result obtained by calculating the correlation between the data related to the behavior of the control target and the activity proposal based on the activity value (evaluation value) obtained by the activity value evaluation model 521 and the past record data stored in the past record database 53. Consequently, the retail agent 301 can correct the parameter of the activity proposal model 511 to a more appropriate value.

Furthermore, when the root mean square is less than the predetermined threshold (step S007: Yes), it is decided that the adjustment of the parameter has converged, and the learning control flow is finished.

According to the above flow, the parameter of the activity proposal model 511 is finally adjusted to output the activity proposal which maximizes the base outcome by taking into account the base situation which is not included in the past record data.

Figure 5:
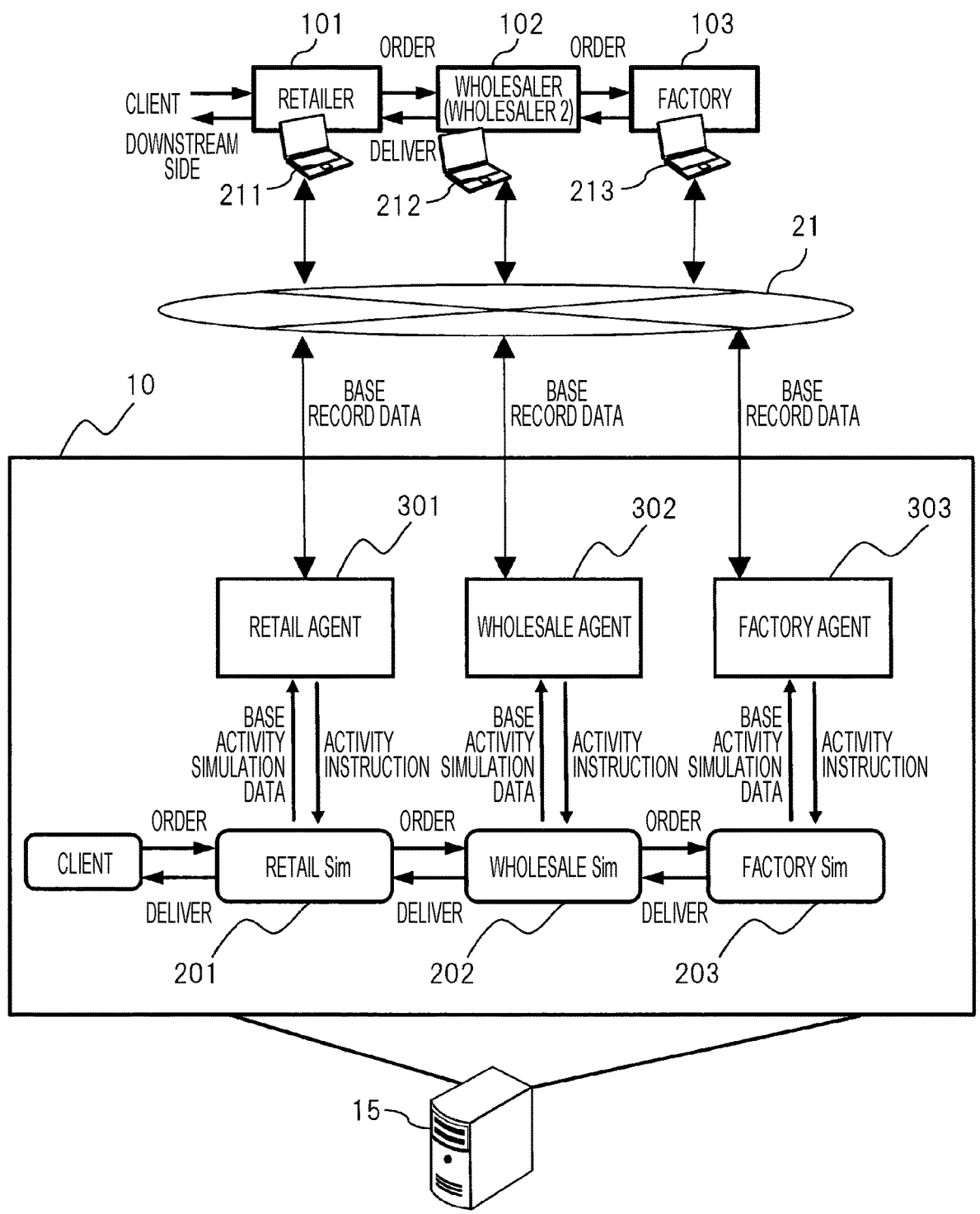
FIG. 5 is a view illustrating a mode for providing service by the learning management system according to the present embodiment.

FIG. 5 is a view illustrating a mode of the learning management system 10 according to the present embodiment which is applied as service by using a server 15 and terminals 211 to 213 at each base via a network 21.

In FIG. 5, each terminal (e.g., the terminal 211) is installed at each base (e.g., the retailer 101). Furthermore, the learning management system 10 according to the present embodiment operates on the server 15. The terminal 211 of the retailer 101 connects to the retail agent 301 of the learning management system 10 via the network 21, and registers the base record data.

FIG. 6 is a view illustrating one example of a screen 2111 through which the terminal 211 registers the base record data of the retail agent 301 in the learning management system 10 which operates on the server 15. An operator of the base registers a sales record and an order record of goods at the base as the base record data via the screen 2111. The registered base record data is registered in the past record database 53 of the retail agent 301.

Figure 7:
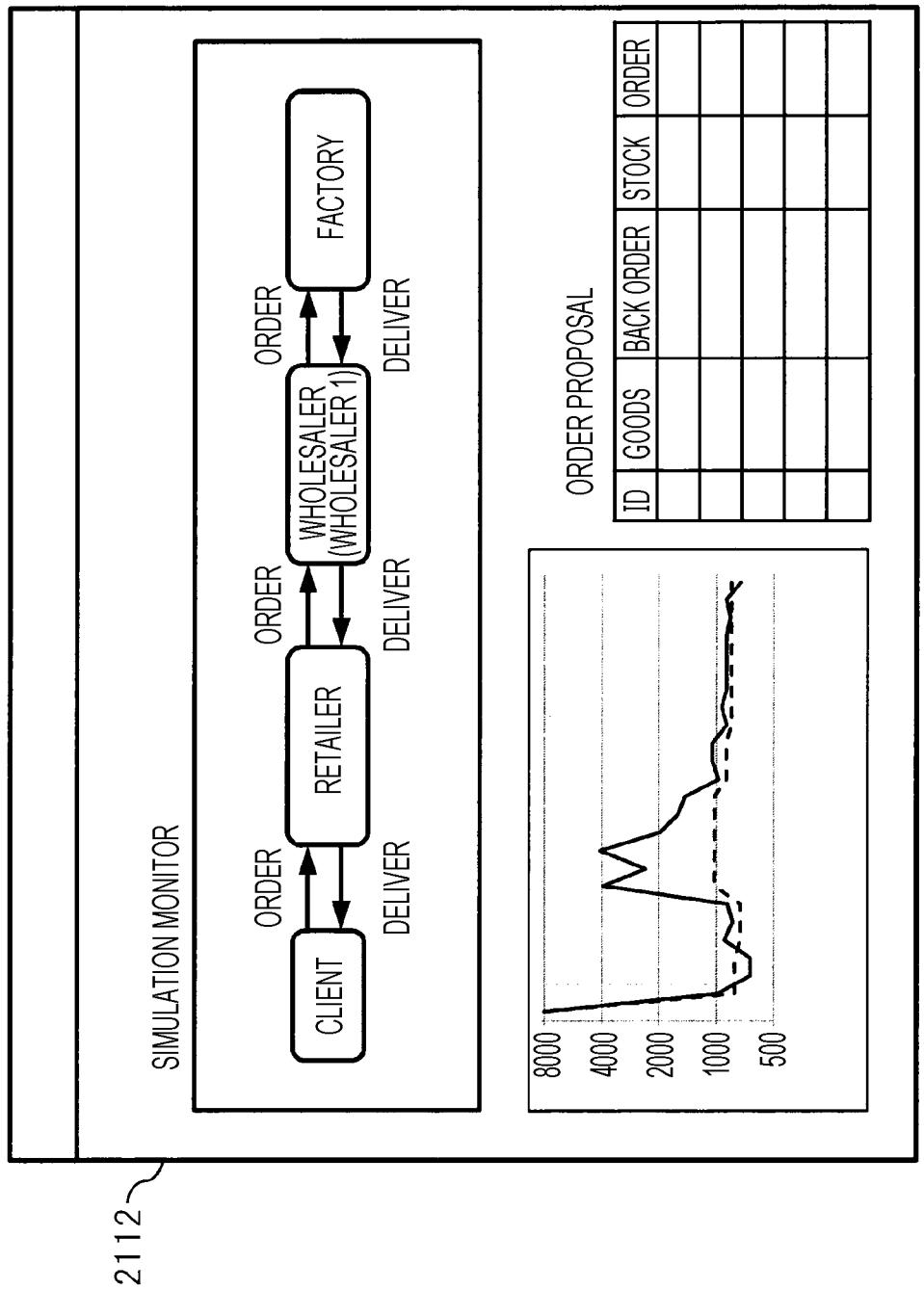
FIG. 7 is a view illustrating one example of a screen which displays a state of a learning flow according to the present embodiment.

FIG. 7 is a view illustrating one example of a screen 2112 through which the terminal 211 checks learning management of the retail agent 301 in the learning management system 10 which operates on the server 15. The operator of the base can check how the learning flow in FIG. 4 is executed by a simulation monitor based on the registered base record data. Furthermore, the operator can check the activity proposal outputted from the activity proposal model 511 of the retail agent 301, and the activity instruction outputted by the activity determination model 522 as an order proposal and an order instruction.

Figure 8:
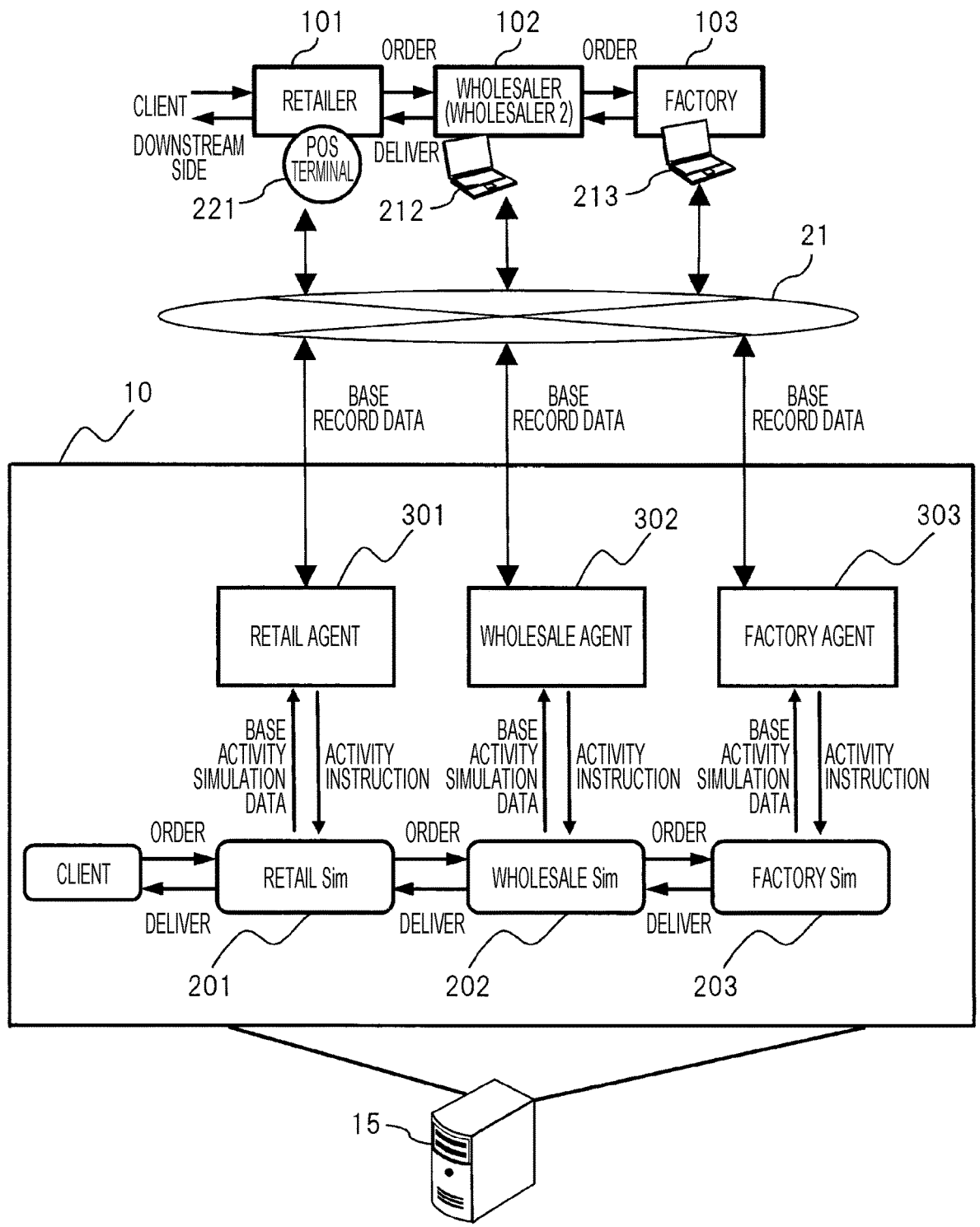
FIG. 8 is a view illustrating another mode for providing service by the learning management system according to the present embodiment.

In this regard, the application mode of the present embodiment is not limited to FIG. 5. As illustrated in, for example, FIG. 8, there may be a mode which is applied as service for establishing connection with a POS terminal 221 which operates in the retailer 101. The present embodiment may be applied to a system which can save labor by directly registering the base record data from the POS terminal 221, and which automatically places an order according to an activity instruction outputted by the activity determination model 522 of the retail agent 301 in the retailer 101.

<Function and Effect>

As described above, according to one embodiment of the present invention, the record learning unit 51 of the retail agent 301 determines the parameter of the activity proposal model 511 based on the base outcome (predetermined evaluation value) and data stored in the past record database 53. Furthermore, the record learning unit 51 and the activity learning unit 52 obtain the base activity simulation data. Furthermore, the record learning unit 51 generates an activity proposal by inputting the base activity simulation data to the activity proposal model at a predetermined timing. Furthermore, the activity learning unit 52 generates an activity instruction by inputting the base activity simulation data and the activity proposal generated by the record learning unit 51 to the activity determination model 522.

Furthermore, the activity learning unit 52 determines the parameters of the activity determination model 522 and the activity value evaluation model 521 based on the base activity simulation data, the activity proposal, the activity instruction, and the predetermined evaluation logic. Furthermore, the record learning unit 51 determines the parameter of the activity value evaluation model 521 by calculating the correlation between the data related to the behavior of the control target, and the activity proposal based on the activity value (evaluation value) obtained by the activity value evaluation model 521, and the past record data stored in the past record database 53.

Thus, the retail agent 301 determines the parameter of the activity proposal model 511 by using the data stored in the past record database 53, and determines the parameters of the activity determination model 522 and the activity value evaluation model 521 by further using the base activity simulation data. Consequently, it is possible to appropriately determine parameters of a subsystem control method in a complex system which cannot be embodied as a simulator and shows a significant change with respect to past record data.

The invention invented by the inventors of this application have been specifically described based on the embodiment. However, the present invention is not limited to the above embodiment, and can be variously modified without departing from the gist of the invention. For example, the above embodiment has been described in detail to describe the present invention for ease of understanding, and is not necessarily limited to those including all described components. Furthermore, as part of the components of the above embodiment, the other components can be added, deleted, or replaced. Naturally, the present invention is applicable to systems such as energy supply chains, traffic systems, and financial systems, too.

Furthermore, a case where each learning unit (the record learning unit 51 and the activity learning unit 52) includes various models (such as the activity proposal model 511) has been described. However, these various models may be held in other units than each of the above learning units. Furthermore, a case where the learning control unit 50 controls each learning unit has been described. However, each learning unit may include this function. That is, each learning unit may control an operation of each learning unit. Furthermore, a case where the record learning unit 51 and the activity learning unit 52 are separated has been described. However, the record learning unit 51 and the activity learning unit 52 may function as an integrated learning unit.

Furthermore, part or all of each of the above components, functions, processing units, and processing means may be designed as, for example, an integrated circuit, i.e., may be realized by hardware. Furthermore, each of the above configuration and functions may be realized as software when a processor interprets and implements a program which realizes each function. Information such as a program, a table, and a file which realizes each function can be stored in recording devices such as memories, hard disks, and Solid State Drives (SSD) or recoding media such as IC cards, SD cards, and DVDs.

Furthermore, a case where processing is performed by executing the program will be described in the following description. However, a processor (e.g., a CPU or a GPU) executes the program to perform predetermined processing while using a storage resource (e.g., memory) and/or an interface device (e.g., communication port) as appropriate, and therefore a subject of processing may be the processor. Similarly, the subject of processing performed by executing the program may be a controller, a device, a system, a calculator, or a node which includes the processor. The subject of processing performed by executing the program only needs to be a computing unit, and may include a dedicated circuit (e.g., an FPGA or an ASIC) which performs specific processing.

The program may be installed in a device such as a calculator from a program source. The program source may be, for example, a program distribution server or a calculator readable storage medium. In a case where the program source is the program distribution server, the program distribution server includes a processor and a storage resource which stores a distribution target program, and the processor of the program distribution server may distribute the distribution target program to another calculator. Furthermore, two or more programs may be realized as one program, and one program may be realized as two or more programs in the following description.

The present invention can be used for a system which learns a behavior of a predetermined control target.

What is claimed is:

1. A learning management system which learns a behavior of a predetermined control target, the learning management system comprising:
 a past record database which accumulates past record data of the predetermined control target; and
 a server including a processor and a memory, wherein the processor is configured to execute programmed instructions that, when executed by the processor, cause the server to
  store a first correlation model of a record learning portion of the server, said learning portion being configured to cause the processor to execute instructions comprising the first correlation model which causes the server output measure proposal data from data related to the behavior of the predetermined control target;
  store a second correlation model of an activity learning portion of the server, said activity learning portion being configured to cause the processor to execute instructions comprising the second correlation model which causes the server to output measure data from simulation state data and the measure proposal data, the simulation state data simulating the behavior of the predetermined control target;
  store a third correlation model of the activity learning portion of the server, said activity learning portion being configured to cause the processor to execute instructions comprising the third correlation model which outputs a measure evaluation value from the simulation state data, the measure proposal data, and the measure data;
  determine a parameter of the first correlation model, using a first record learning portion of the record learning portion configured to calculate a correlation between the data related to the behavior of the predetermined control target, and the measure proposal data based on a predetermined evaluation value and the past record data stored in the past record database;
  obtain the simulation state data, using the record learning portion and the activity learning portion of the server configured to simulate the behavior of the predetermined control target;
  generate the measure proposal data by inputting the obtained simulation state data to the first correlation model, and, using the record learning portion and the activity learning portion of the server configured to generate the measure data by inputting the simulation state data obtained and the measure proposal data to the second correlation model;
  determine parameters of the second correlation model and the third correlation model, using the activity learning portion of the server, based on the simulation state data obtained, the measure proposal data generated, the measure data, and a predetermined evaluation logic; and
  determine the parameter of the first correlation model again, using a first record learning portion of the record learning portion configured to calculate the correlation between the data related to the behavior of the predetermined control target and the measure proposal data based on an evaluation value obtained by the third correlation model, and the past record data stored in the past record database.

2. The learning management system according to claim 1, further comprising a simulation activity database which associates and stores the simulation state data, and the measure proposal data and the measure data.

3. The learning management system according to claim 1, wherein the simulation state data is newly obtained based on an adjustment amount of the parameter of the first correlation model determined again.

4. A learning management method for learning a behavior of a predetermined control target, the method comprising:
 accumulating past record data of the predetermined control target using a record database;
 storing a first correlation model which outputs measure proposal data from data related to the behavior of the predetermined control target;
 storing a second correlation model which outputs measure data from simulation state data and the measure proposal data, the simulation state data simulating the behavior of the predetermined control target;
 storing a third correlation model which outputs a measure evaluation value from the simulation state data, the measure proposal data, and the measure data;
 determining, in a first record learning step, a parameter of the first correlation model by calculating a correlation between the data related to the behavior of the predetermined control target, and the measure proposal data based on a predetermined evaluation value and the past record data stored in the record database;
 obtaining, in a simulation state data obtaining step, the simulation state data which simulates the behavior of the predetermined control target;
 generating, in a measure data generating step, the measure proposal data by inputting the simulation state data obtained in the simulation state data obtaining step to the first correlation model, and generating the measure data by inputting the simulation state data obtained in the simulation state data obtaining step and the measure proposal data to the second correlation model;

determining, in an activity learning step, parameters of the second correlation model and the third correlation model based on the simulation state data obtained in the simulation state data obtaining step, the measure proposal data generated in the measure data generating step, the measure data generated in the measure data generating step, and a predetermined evaluation logic; and determining, in a second record learning step, the parameter of the first correlation model again by calculating the correlation between the data related to the behavior of the predetermined control target and the measure proposal data based on an evaluation value obtained by the third correlation model, and the past record data stored in the record database.

* * * * *